United States Patent
Weng et al.

(10) Patent No.: US 6,853,929 B2
(45) Date of Patent: Feb. 8, 2005

(54) PIPELINE CONTROL FOR POWER MANAGEMENT

(75) Inventors: Kuoyin Weng, Milpitas, CA (US); Hsilin Huang, Milpitas, CA (US); Chienkang Cheng, Los Altos, CA (US)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/428,392

(22) Filed: May 1, 2003

(65) Prior Publication Data

US 2004/0220757 A1 Nov. 4, 2004

(51) Int. Cl.$^7$ .......................... G06F 19/00; G05B 11/00
(52) U.S. Cl. ........................ 702/60; 326/37; 700/22; 713/300
(58) Field of Search ............................. 702/57, 60–61; 700/286, 22; 713/300, 320; 326/37, 93

(56) References Cited

U.S. PATENT DOCUMENTS 5,754,436 A * 5/1998 Walsh et al. ................ 713/300
6,717,434 B2 * 4/2004 Takahashi et al. ............ 326/37
2002/0133241 A1 * 9/2002 Takahashi et al. ............ 700/22

* cited by examiner

Primary Examiner—John Barlow
Assistant Examiner—John Le
(74) Attorney, Agent, or Firm—Anthony B. Diepenbrock, III; Dechert LLP

(57) ABSTRACT

A method and apparatus for managing power consumption in logic modules without causing power surges. A first and second logic module operate in response to a first and second clock signal, respectively, to carry out a command. When the command arrives, the first logic module begins to operate and indicates that it is busy. After a first delay, the second module begins to operate and indicates that it is busy. When both modules are finished and no new command is available, the busy indicators are deactivated and after a second delay the first clock signal is deactivated. A third delay after the first clock signal is deactivated, the second clock is deactivated. The first, second and third delays are programmable to avoid power surges in the respective modules.

20 Claims, 5 Drawing Sheets

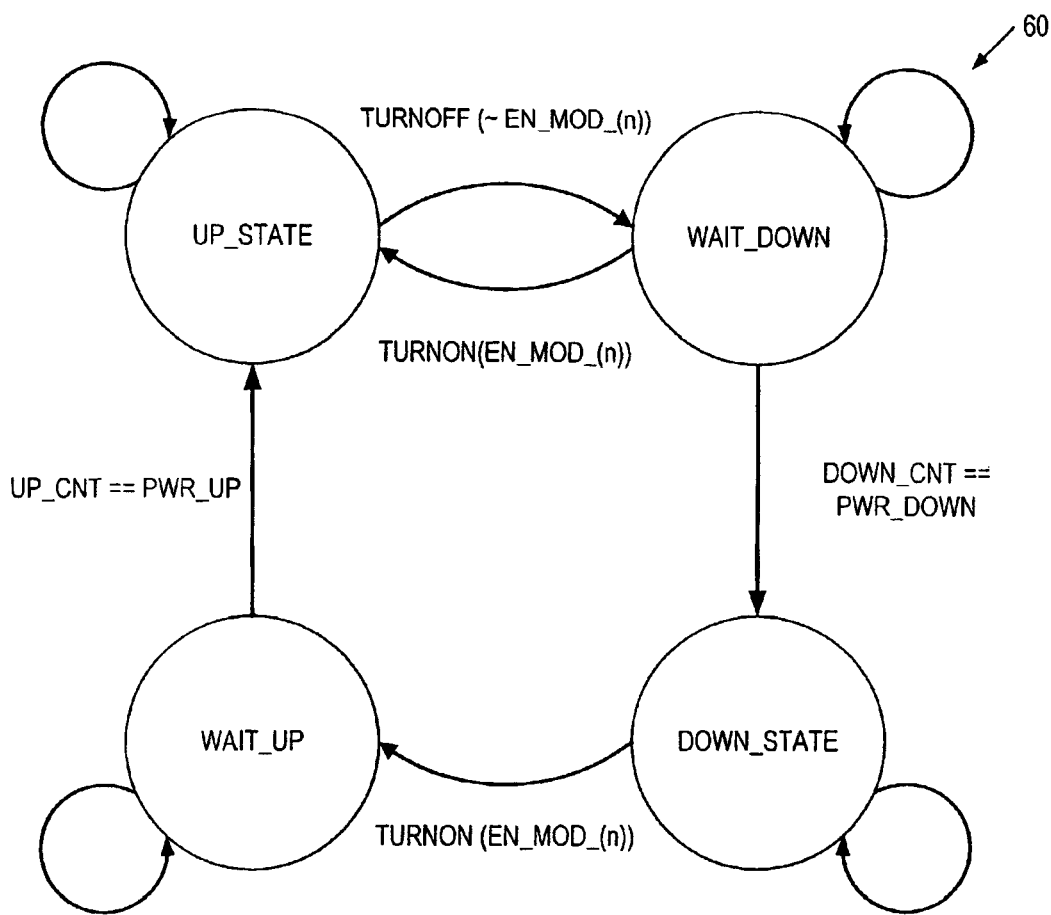
FIG. 3
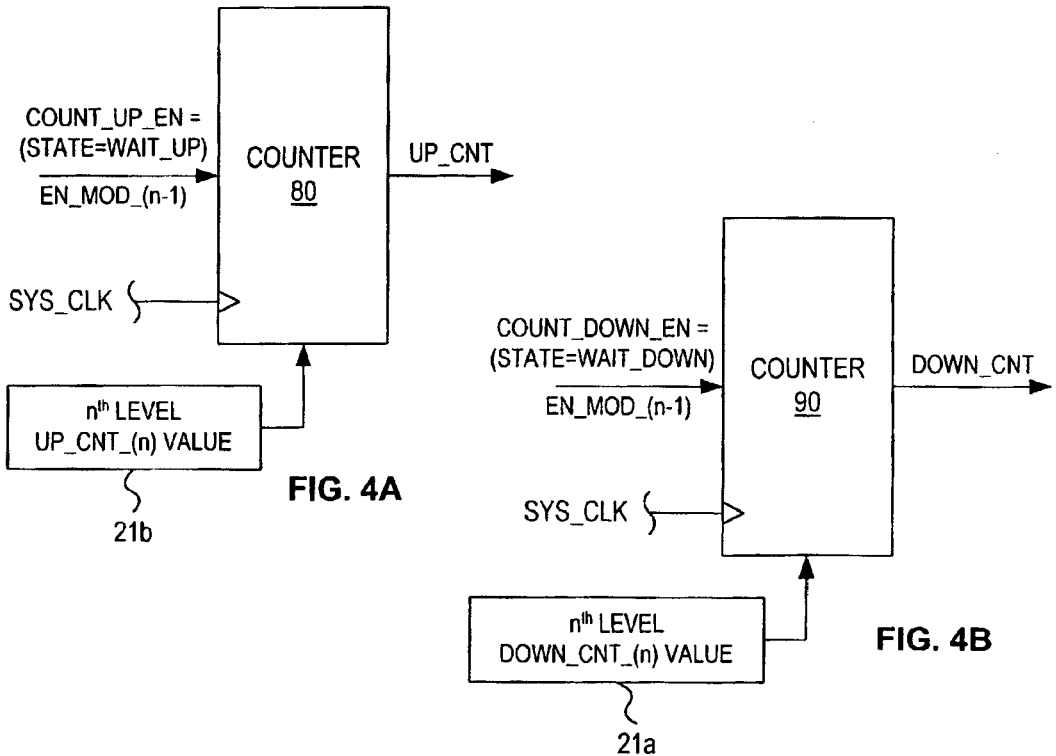

PIPELINE CONTROL FOR POWER MANAGEMENT

FIELD OF THE INVENTION

The present invention relates generally to power management in integrated circuits, and more specifically to managing power consumption in a system including at least two modules.

DESCRIPTION OF THE RELATED ART

Power management is a very important aspect of very large scale integrated (VLSI) circuit design, especially for VLSI chips used in laptop computers and other portable electronic devices. In accordance with one method of managing power in VLSI chips, a system clock signal is disabled during a power saving time interval so that the gates of the chip consume less power. Of course, the system power $V_{DD}$ is available on rails of the chip during the power saving interval. However, less power is consumed during this interval because the amount of power consumed by the gates is a function of the dynamic operation of the gates. When the system clock is enabled, gate operation is dynamic and more power is consumed, but when the system clock is disabled, the gate operation is static and less power is consumed.

As the gate counts increase in VLSI chips, power management in accordance with the above described technique becomes more problematic due to increased power surges and IR drops, which occur upon transitions between the power saving time intervals and normal operation. The magnitudes of the power surges and IR drops increase as the gate counts increase, which results in increasingly unstable conditions in the system.

What is needed is a method and apparatus for managing power in VLSI chips that does not cause stability problems.

BRIEF SUMMARY OF THE INVENTION

Briefly, a presently preferred embodiment of the present invention provides an apparatus for managing power consumption in a system including at least two modules for processing commands. The apparatus includes first and second modules for performing operations, and first and second control logic for performing power management of the first and second modules, respectively. The first module has a clock input for receiving a first clock signal and is operative to perform operations based on a received command and to generate a first busy signal indicating when the first module is busy. The second module has a clock input for receiving a second clock signal and is operative to perform operations and to generate a second busy signal indicating when the second module is busy. The first control logic is connected to receive the first and second busy signals from the first and second modules, respectively, and has inputs for receiving a system clock signal and a command available signal indicating when a command is available, and an output for providing an enable signal. The first control logic is operative to activate the enable signal and the first clock signal when a command is available, and deactivate the enable signal and the first clock signal after a first time delay following an indication that none of the modules is busy and a command is not available. The second control logic has inputs for receiving the enable signal and the system clock signal, and is operative to activate the second clock signal after a second time delay following the assertion of the enable signal and to deactivate the second clock signal after a third time delay following the de-assertion of the enable signal.

A method for managing power consumption in a system, in accordance with the present invention, includes receiving a command to perform one or more operations and an indication that a command is available, activating a first clock signal in response to the received command, and performing operations in a first logic module in response to the activated first clock signal based on the received command. A first busy indicator is activated while performing operations in response to the activated first clock signal. The method further includes activating a second clock signal after a first time delay following the activated first clock signal, performing operations in a second logic module in response to the activated second clock signal, and activating a second busy indicator while performing operations in response to the activated second clock signal. The first busy and second busy indicators are deactivated when operations in the first and second modules, respectively, are completed. If there is no indication that a command is available, the first clock signal is deactivated after a second time delay following the deactivation of all of the busy indicators, the second clock signal is deactivated after a third time delay following the deactivation of the first clock signal.

The above described time delays can be different and can be programmed differently in order to optimize power consumption in the system. Those of ordinary skill in the art will understand that experimentation may be performed to determine optimal time delays in order to optimize power consumption.

An advantage of the present invention is that power consumption is managed efficiently in a VLSI system without causing power surges and IR drops.

Another advantage is that power consumption is managed efficiently in a VLSI system without causing instability.

BRIEF DESCRIPTION OF THE DRAWINGS

These and other features, aspects and advantages of the present invention will become better understood with regard to the following description, appended claims, and accompanying drawings where:

FIG. 3 is a state diagram depicting operation of a subordinate level control logic unit in accordance with the present invention, the depicted states including a power-up state and a power-down state;

FIG. 4A is a block diagram illustrating a first counter that implements a time delay incurred upon transition to the power-up state illustrated in FIG. 3;

FIG. 4B is a block diagram illustrating a second counter that implements a time delay incurred upon transition to the power-down state illustrated in FIG. 3;

DETAILED DESCRIPTION OF THE PREFERRED EMBODIMENTS

Figure 1:
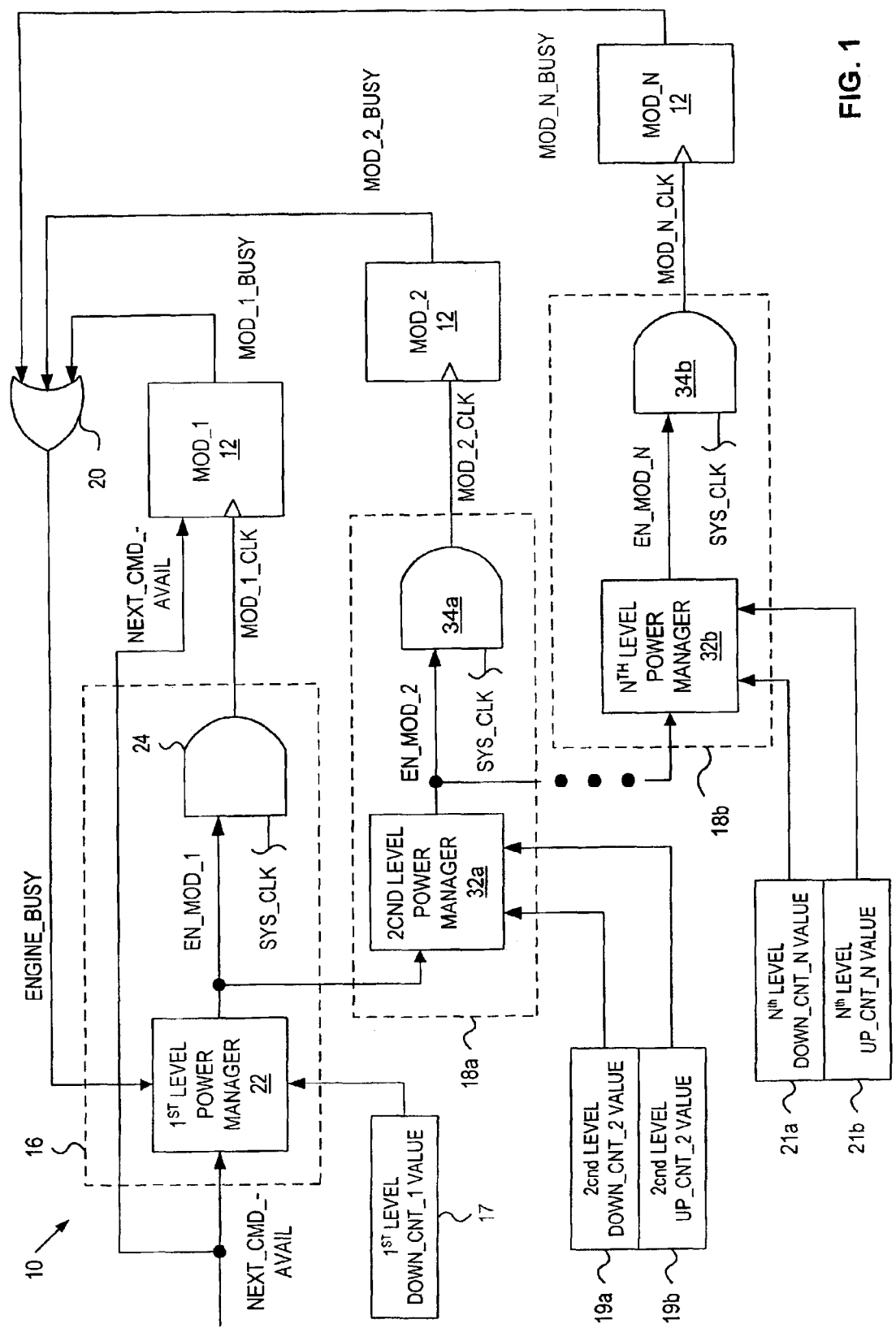
FIG. 1 is a schematic circuit block diagram illustrating a system including a pipeline having a plurality of modules, and control logic units for managing power consumed by the modules in accordance with the present invention.

FIG. 1 shows a generalized schematic circuit block diagram of a system at 10 including a plurality of N modules 12, each being operative to perform operations based on commands. In the depicted embodiment, the system 10 is a VLSI circuit chip having a pipeline processing architecture, and each of the modules 12 is a stage of a pipeline (also referred to as an engine). For example, the pipeline may be a graphics pipeline for processing graphics commands as they become available. However, it will be understood by those of ordinary skill in the art that the present invention is not limited to managing power consumption in a pipeline, but may be used to manage power consumption in any system having at least two modules. In the depicted embodiment, the system includes N=3 modules designated MOD_1, MOD_2 and MOD_N, wherein MOD_1 is the first level module in the pipeline, MOD_2 is a second level module, and MOD_N is a third level module. The first level module MOD_1 receives commands as they become available via a command input (not shown), and is operative to perform operations based on the commands. Each of the modules may be a section or partition of the chip 10. For example, in a hierarchical layout, each module is a partition. In the pipeline embodiment, the subordinate level modules MOD_2 and MOD_N perform operations that are dependent upon the operation of MOD_1.

The first level module MOD_1 includes: a clock input for receiving a first gated clock signal designated MOD_1_CLK derived from a system clock signal designated SYS_CLK as further described below; and an output providing a first level busy signal designated MOD_1_BUSY indicating when the first level module is either busy (e.g., busy performing operations based on available commands) or idle. Likewise, the subordinate level modules MOD_2 and MOD_N include: clock inputs for receiving second and third gated clock signals designated MOD_2_CLK and MOD_N_CLK respectively; and outputs providing busy signals designated MOD_2_BUSY and MOD_N_BUSY respectively indicating when the second and third level modules are either busy or idle.

For certain operations performed by the pipeline, it is not necessary that all of the modules receive their corresponding gated clock signal. For example, only MOD_1 and MOD_2 may be needed for a certain function over a certain time interval, and therefore the third gated clock signal MOD_N_CLK may be disabled for a certain period of time. As explained below, the gated clock disabling intervals are programmable. For example, the first gated clock signal MOD_1_CLK may be enabled, and then ten clock cycles later, the second gated clock signal MOD_2_CLK may be enabled, and five clock signals later, the nth gated clock signal MOD_N_CLK may be enabled. The number of gated clocks enabled at any one time is also programmable. Each of the gated clocks is enabled and disabled not just as a function of time, but also as a function of whether the corresponding modules are needed. The power management control logic of the present invention is programmable in terms of which of the gated clock signals are enabled at any given time, and how long the gated clock signals are enabled for. The goal is to manage power such that the gated clocks are only applied to corresponding modules as needed to perform certain operations.

A first level control logic unit 16 is provided to manage power consumption in the first level module MOD_1. Similarly, each of the N-1 subordinate level modules 12 is provided with a corresponding one of N-1 subordinate level control logic units 18 for managing power in the corresponding module. In the depicted embodiment, second and third level control logic units designated 18a and 18b are provided to manage power consumption in the second and third level modules MOD_2 and MOD_N respectively. The system 10 further includes an OR gate 20 having N inputs for receiving the N busy signals designated MOD_1_BUSY through MOD_N_BUSY from the N modules 12, and an output providing an ENGINE_BUSY signal that indicates when at least one of the modules 12 is busy.

The first level control logic unit 16 includes: an input for receiving a signal designated NEXT_CMD_AVAIL, which provides notice of commands becoming available for execution by the pipeline; an input for receiving the ENGINE_BUSY signal; an input for receiving a first level power-down value 17 designated DOWN_CNT_1; an output providing the first gated clock signal MOD_1_CLK; and an output providing a first level enable signal designated EN_MOD_1 which enables the first gated clock signal as explained below.

The logic control unit 16 also includes a first level power manager 22 having: inputs for receiving the ENGINE_BUSY signal, NEXT_CMD_AVAIL signal, and the DOWN_CNT_1 value 17; and an output providing the first level enable signal EN_MOD_1 which is asserted based on whether or not the modules are currently busy and whether or not a next command is currently available. The logic control unit 16 further includes an AND Gate 24 having a first input for receiving the first level enable signal EN_MOD_1, a second input for receiving the system clock SYS_CLK, and an output, which provides the first gated clock signal MOD_1_CLK. The first gated clock signal MOD_1_CLK is enabled at the output of the AND gate 24 in response to the first level enable signal EN_MOD_1 being asserted in an active high state ("HI") as controlled by the first level power manager 22.

The control logic unit 16 is operative to assert the first enable signal EN_MOD_1 to enable the first gated clock signal MOD_1_CLK when a next command becomes available as indicated by the signal NEXT_CMD_AVAIL being HI. After the first level module MOD_1 is done performing operations in response to commands, it de-asserts its associated MOD_1_BUSY signal. It is advantageous to wait a certain amount of time after the first level module MOD_1 becomes idle before disabling the first gated clock signal because a next command may become available as indicated by the NEXT_CMD_AVAIL signal within a certain amount of time during which the first level module should continue to receive the first gated clock signal. Likewise, there is also a programmable turn on delay as explained further below. The logic unit 16 is further operative to de-assert the first enable signal to disable the first gated clock signal MOD_1_CLK after a first level power-down time delay following an indication that none of the modules 12 is busy and a next command is not currently available. As explained below, the duration of the first level power-down time delay is determined based on the DOWN_CNT_1 value. In one embodiment, the DOWN_CNT_1 value 17 is programmable, or user selected. As an example, the value 17 may be a 16-bit value selected by a user. It should be noted that the unit 16 acts responsively to each of the busy signals MOD_1_BUSY, MOD_2_BUSY and MOD_N_BUSY by responding to the ENGINE_BUSY signal which indicates when at least one of the modules is busy. In the preferred embodiment, the first level logic control unit 16 is operative to enable the first gated clock signal MOD_1_CLK for at least as long as one of modules 12 is currently busy.

As explained below, power consumption in the subordinate level modules MOD_2 through MOD_N is managed differently as compared with the management of the first level module MOD_1, and therefore the subordinate level control logic units 18 are different from the first level control logic unit 16. Each of the subordinate level control logic units 18 includes: an input for receiving an enable signal EN_MOD_(n−1) from the immediately preceding level logic unit 16 or 18; and an output providing a present level enable signal EN_MOD_(n). For example, the second level control logic unit 18*a* has an input for receiving the first enable signal EN_MOD_1, and an output providing a second level enable signal EN_MOD_2. Likewise, the third level control logic unit 18*b* has an input for receiving the second level enable signal EN_MOD_2, and an output providing a third level enable signal EN_MOD_3. Each of the subordinate level control logic units 18 also includes: inputs for receiving a power-down count value 19*a* or 21*a* and a power-up count value 19*b* or 21*b* designated DOWN_CNT_(n) and UP_CNT_(n) respectively; and an output providing an associated one of the gated clock signals MOD_(n)_CLK. In the depicted embodiment, the second and third level control units 18*a* and 18*b* provide the gated clock signals MOD_2_CLK and MOD_N_CLK respectively, and receive power-down count values DOWN_CNT_2 and DOWN_CNT_N respectively, and power-up count values designated UP_CNT_2 and UP_CNT_N respectively.

Each of the subordinate level control logic units 18 includes a subordinate level power manager 32. In the depicted embodiment, the logic units 18*a* and 18*b* include subordinate level power managers 32*a* and 32*b* respectively. The power managers 32*a* and 32*b* have identical logic, but are responsive to different inputs. Specifically, the second level power manager 32*a* is operative to assert the second enable signal EN_MOD_2 to enable the second gated clock signal MOD_2_CLK after a second level power-up time delay following the assertion of the first enable signal EN_MOD_1. The power manager 32*a* is further operative to de-assert the second level enable signal EN_MOD_2 to disable the second gated clock signal MOD_2_CLK after a second level power-down time delay following the de-assertion of the first enable signal EN_MOD_1. As explained below, the durations of the second level power-up and power-down time delays are determined based on the UP_CNT_2 and DOWN_CNT_2 values respectively. In one embodiment, each of the power-up and power-down count values 19*a*, 19*b*, 21*a* and 21*b* is programmable, or user selected. The power management circuitry of the present invention provides for enabling and disabling selected ones of the gated clock signals MOD_1, MOD_2 and MOD_N during selected programmable time intervals.

Each of the subordinate level control logic units 18 further includes an AND gate 34 having a first input for receiving the present level enable signal EN_MOD_(n), a second input for receiving the system clock signal SYS_CLK, and an output providing the nth gated clock signal MOD_(n)_CLK. For example, in the second level control logic unit 18*a*, the second gated clock signal MOD_2_CLK is enabled at the output of an AND gate 34*a* in response to the second level enable signal EN_MOD_2 being asserted in the active high state as controlled by the second level power manager 32*a*.

Each of the subordinate level power managers 32 is operative to assert it's corresponding enable signal EN_MOD_(n) to enable its corresponding gated clock signal MOD_(n)_CLK after a subordinate level power-up time delay following the assertion of the enable signal EN_MOD_(n−1) received from the preceding level. Each of the subordinate level power managers 32 is further operative to de-assert its corresponding enable signal EN_MOD_(n) to disable its corresponding gated clock signal MOD_(n)_CLK after a corresponding subordinate level power-down time delay following the de-assertion of the preceding level enable signal EN_MOD_(n−1). For example, the second level power managers 32*a* is operative to: assert the second enable signal EN_MOD_2 to enable the second gated clock signal MOD_2_CLK after a second level power-up time delay following the assertion of the first enable signal EN_MOD_1; and de-assert the second enable signal EN_MOD_2 to disable the second gated clock signal MOD_2_CLK after a second level power-down time delay following the de-assertion of the first enable signal EN_MOD_1. The second level power managers 32*a* is operative to assert the second enable signal to enable the second gated clock signal for at least as long as the first gated clock signal is enabled.

Figure 2:
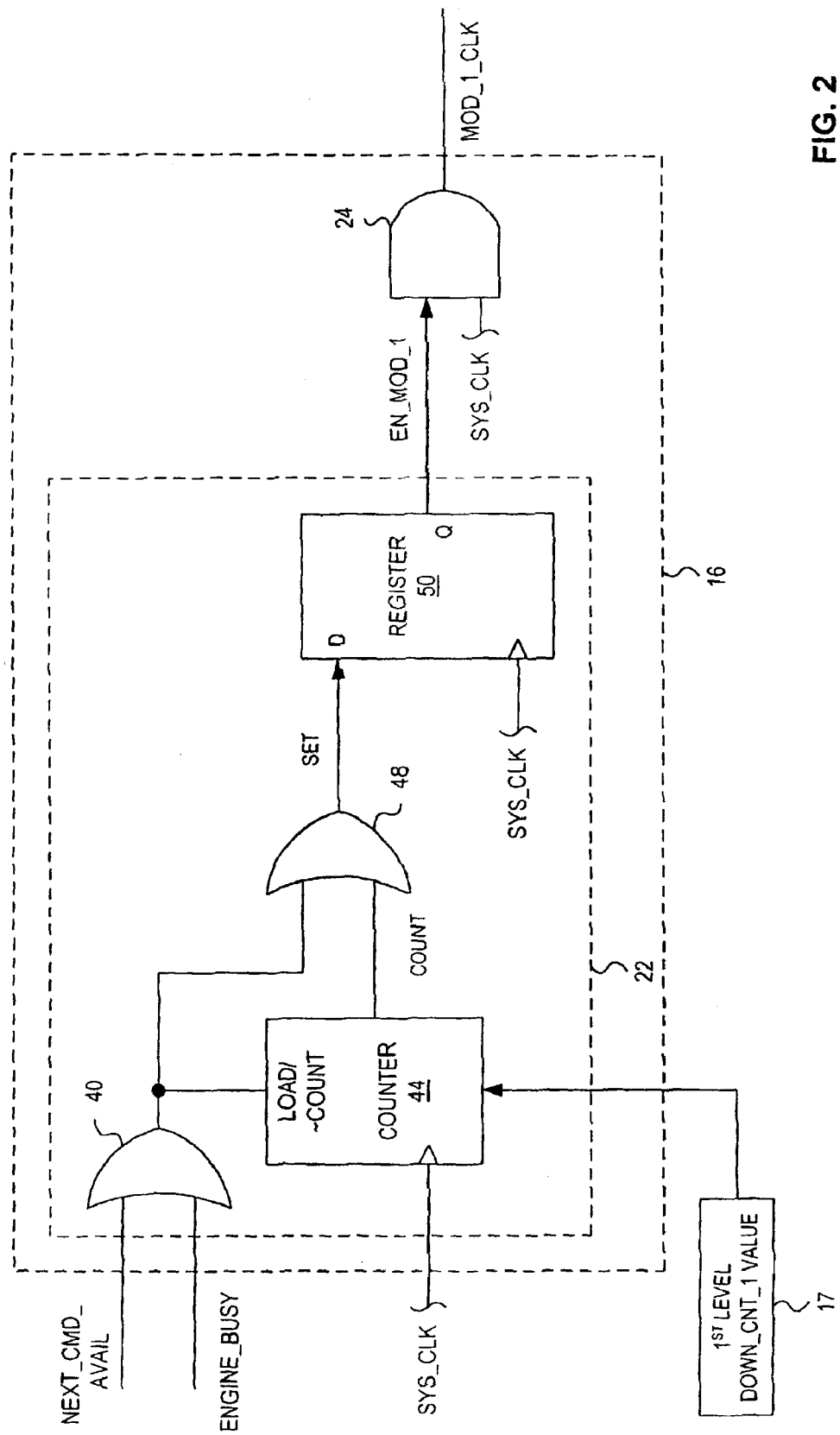
FIG. 2 is a schematic circuit block diagram illustrating details of a first level control logic unit for managing power consumption in a first level module in accordance with the present invention.

FIG. 2 shows a schematic circuit block diagram illustrating further details of the power manager 22 of the first level control logic unit 16 (FIG. 1). The power manager 22 includes: a first OR gate 40 having a first input for receiving the NEXT_CMD_AVAIL signal, a second input for receiving the ENGINE_BUSY signal, and an output that is asserted to produce an active HI signal when either of the NEXT_CMD_AVAIL signal or the ENGINE_BUSY signal is HI. The power manager 22 further includes: a counter 44 having a LOAD input responsive to the signal provided from the output of the first OR Gate 40, a count value input responsive to the first level DOWN_CNT_1 value, a system clock input for receiving the system clock signal SYS_CLK, and an output for generating a count done signal designated COUNT; a second OR Gate 48 having a first input for receiving the output of the first OR Gate 40, a second input for receiving the COUNT signal from the output of the counter 44, and an output for generating a signal designated SET; and a register 50 having a D input for receiving the SET signal from the second OR Gate 48, a clock input for receiving the system clock signal SYS_CLK, and a Q output providing the first level enable signal EN_MOD_1.

In the depicted embodiment, the register 50 is a D type register, and it's Q output is set to the same state that is present on the D input upon a positive going transition of the SYS_CLK signal. When the ENGINE_BUSY signal is HI (indicating that at least one of the modules 12 shown in FIG. 1 is busy) or the NEXT_CMD_AVAIL signal is HI (when a next command is available), the outputs of the second and third OR gates 40 and 48 are HI and the Q output of the register 50 asserts the first enable signal EN_MOD_1 which enables the first level gated clock MOD_1_CLK. However, when the SET signal provided at the output of the second OR gate 48 transitions to the LO state, the first enable signal EN_MOD_1 provided at the Q output of the register 50 transitions to the LO state upon a next positive going transition of the system clock signal SYS_CLK.

When the ENGINE_BUSY signal is HI or the NEXT_CMD_AVAIL signal is HI, then the output of the first OR gate 40, which is provided at the LOAD input of the counter 44, is HI. In response to a positive going transition at the LOAD input, the counter causes the COUNT signal to transition to the HI state upon a next positive going transition of the system clock signal SYS_CLK. The COUNT signal remains HI for at least as long as the LOAD input is HI. After the ENGINE_BUSY signal transitions to the active LO state (when all modules de-assert their corresponding busy signals), if there is not a next command currently available (the NEXT_CMD_AVAIL signal is also LO), then the output signal provided by the first OR gate 40 undergoes a negative going transition from HI to LO which is received at the LOAD input of the counter. Upon a next transition of the system clock signal SYS_CLK following the negative going transition at the LOAD input, the counter begins counting down from the programmable DOWN_
CNT_1 value. When the counter is done counting, the
COUNT signal transitions from HI to LO. If the ENGINE_
BUSY signal and NEXT_CMD_AVAIL signal are still LO
when the COUNT signal transitions to the LO state, then the
SET signal provided at the output of the second OR gate 48
transitions to the LO state at the D input of the register
causing the first enable signal EN_MOD_1 provided at the
Q output of the register to be de-asserted as it transitions
from HI to LO upon a next positive going transition of the
system clock signal SYS_CLK.

FIG. 3 shows a state diagram depicting the operation of
one of the subordinate level power managers 32 (FIG. 1).
The subordinate level power manager 32 may operate in
four different states including: a power-up state designated
UP_STATE wherein the nth level enable signal
EN_MOD_(n) is asserted to enable the nth gated clock
signal MOD_(n)_CLK; a power-down state designated
DOWN_STATE wherein the nth level enable signal
EN_MOD_(n) is de-asserted and maintained at the active
LO state to disable the nth gated clock signal MOD_(n)_
CLK; a power-down wait state designated WAIT_DOWN
wherein the power manager 32 (FIG. 1) waits for a duration
of time (a subordinate level power-down time delay) fol-
lowing de-assertion of the previous level enable signal
EN_MOD_(n−1) before transitioning from the
UP_STATE to the DOWN_STATE; and a power-up wait
state designated WAIT_UP wherein the power manager
waits for a duration of time (a subordinate level power-up
time delay) following assertion of the previous level enable
signal EN_MOD_(n−1) before transitioning from the
DOWN_STATE to the UP_STATE.

The state machine of each subordinate level power man-
ager operates based on the preceding level enable signal
EN_MOD_(n−1) received from the preceding level control
logic unit 16 or 18 (FIG. 1). For example, the second level
power manager 32a (FIG. 1) receives the first level enable
signal EN_MOD_1. The state machine idles in the DOWN
state. When the previous level clock enable signal
EN_MOD_(n−1) transitions from LO to HI, the state
machine transitions from the DOWN state to the WAIT_UP
state. It is necessary that the subordinate level power man-
ager not enable the corresponding nth level gated clock
signal immediately upon assertion of the preceding level
enable signal. Therefore, upon assertion of the previous
level enable signal EN_MOD_(n−1), the state machine
transitions from the DOWN state to the WAIT_UP state,
initiates a first counter to begin counting a number of clocks
to wait, and after the counter is done counting, transitions
from the WAIT_UP state to the UP state.

After transition to the UP state, the state machine remains
in the UP state until the preceding level clock enable signal
EN_MOD_(n−1) transitions from HI to LO. Upon
de-assertion of the previous level clock enable signal
EN_MOD_(n-1), the state machine transitions from the UP
state to the WAIT_DOWN state and remains in the WAIT_
DOWN state for a predetermined time period measured by
a second counter. As explained below, the second counter is
initiated, that is begins counting, upon transition of the state
machine from the UP state to the WAIT_DOWN state.

When in the WAIT_DOWN state, if the previous level
clock enable signal EN_MOD_(n-1) transitions again from
LO to HI, the state machine returns from the WAIT_DOWN
state to the UP state so that the present level gated clock
signal MOD_(n)_CLK is enabled. The state machine
depicted in FIG. 3 operates in accordance with the following
equation,

CLKEN==(ST==UP_STATE)||(ST==WAIT_DOWN)

The above equation is the output term of the state machine
illustrated in FIG. 3. While in the UP state or the WAIT_
DOWN state, the corresponding nth level enable signal
EN_MOD_(n) is enabled. When the state machine is in the
DOWN state or the WAIT_UP state, the present level gated
clock signal EN_MOD_(n) is disabled or turned off.

FIG. 4A shows a power-up counter 80, which is used to
implement the subordinate level power-up time delay during
which the subordinate level power manager 32 operates in
the WAIT_UP state (FIG. 3) before transitioning to the
UP_STATE. The power-up counter includes a count enable
input for receiving a count-up enable signal designated
COUNT_UP_EN, a system clock input for receiving the
SYS_CLK signal, and an output producing a power-up
count signal designated UP_CNT. The power-up counter 80
begins counting down from the nth level power-up time
delay value 21b designated UP_CNT_(n) when the previ-
ous level enable signal EN_MOD_(n−1) is asserted as it
transitions from the LO state to the HI state.

FIG. 4B shows a power-down wait counter 90, which is
used to implement the WAIT_DOWN state (FIG. 3). The
counter 90 includes a count enable input, a system clock
input for receiving the system clock signal SYS_CLK, and
an output for generating a power-down wait count signal
designated DOWN_CNT. The power-down counter is ini-
tialized to begin counting down from the nth level power-
down time delay value 21a designated DOWN_CNT_(n)
when the previous level enable signal EN_MOD_(n−1) is
de-asserted (transitions from HI to LO).

The first and second counters 80 and 90, which are used
to implement the state machines of the subordinate level
power managers 32 (FIG. 1), can be different and can be
programmed differently in order to optimize power con-
sumption for the whole chip 10 (FIG. 1). Those of ordinary
skill in the art will understand that experimentation may be
performed to determine optimal counter values 17, 19a, 19b,
21a and 21b (FIG. 1) in order to optimize power consump-
tion in the chip by programming the counters.

Figure 5A:
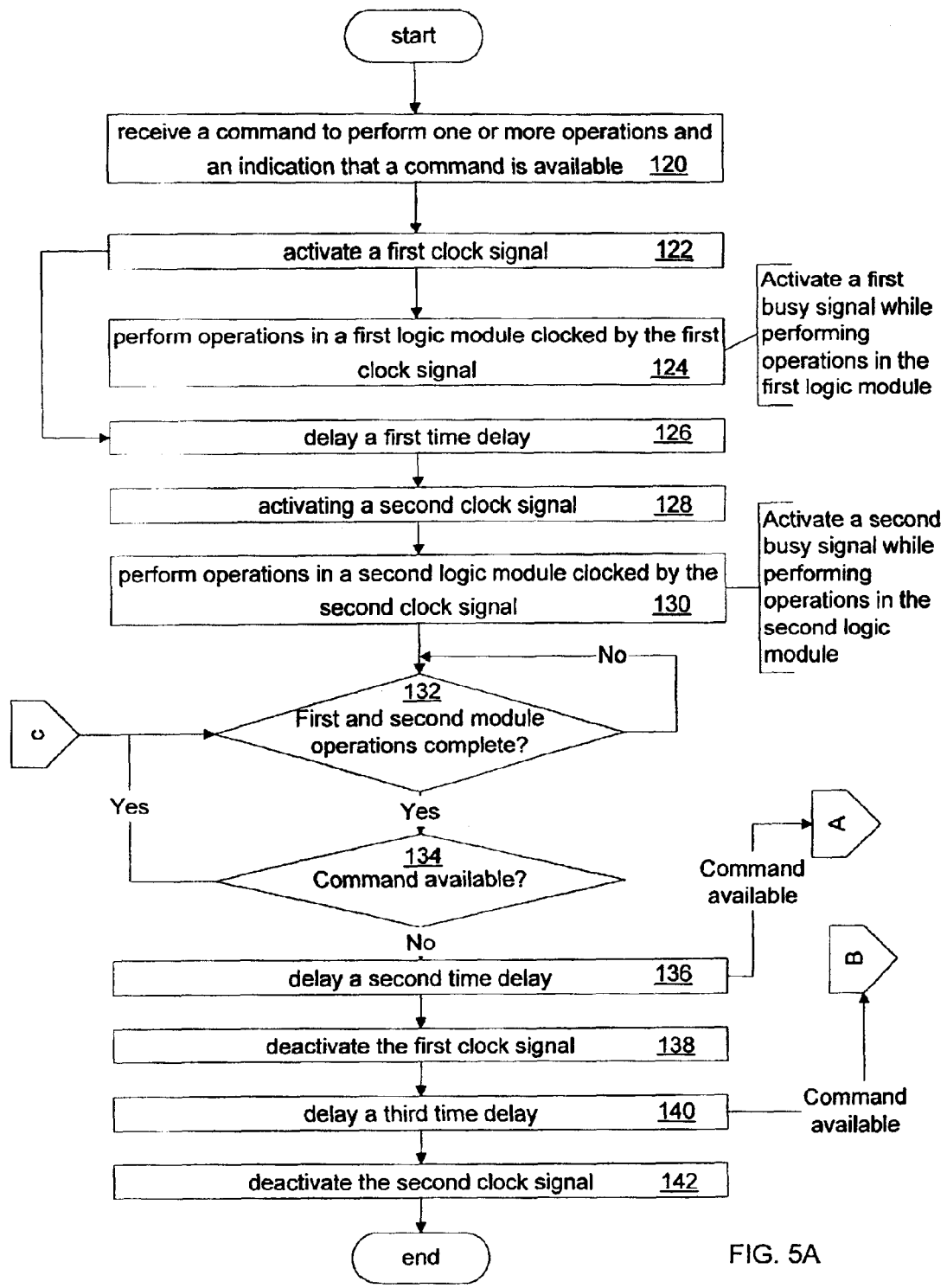
FIGS. 5A–5B are a flow chart showing a process in accordance with the present invention.

FIG. 5A is a flow chart showing a process in accordance
with the present invention. In step 120 a command is
received to perform on or more operations along with an
indication that the command is available. In step 122, the
first clock signal is activated and, in step 124, operations are
performed in the first logic module which is clocked by the
first clock signal. Following step 122, a first time delay is
started in step 126 after which the second clock signal is
enabled, in step 128. Operations are then performed in the
second logic module which is clocked by the second clock
signal. If operations in both the first and second logic
modules are complete and there is no command available, as
determined in steps 132 and 134, a second time delay is
started in step 136, after which the first clock signal is
deactivated, in step 138. This starts a third time delay in step
140 after which the second clock signal is deactivated in step
142. If a command is available, as determined in step 134,
after the first and second logic modules have completed their
operations in step 132, then that command is processed
while both logic modules have their clocks activated.

Figure 5B:
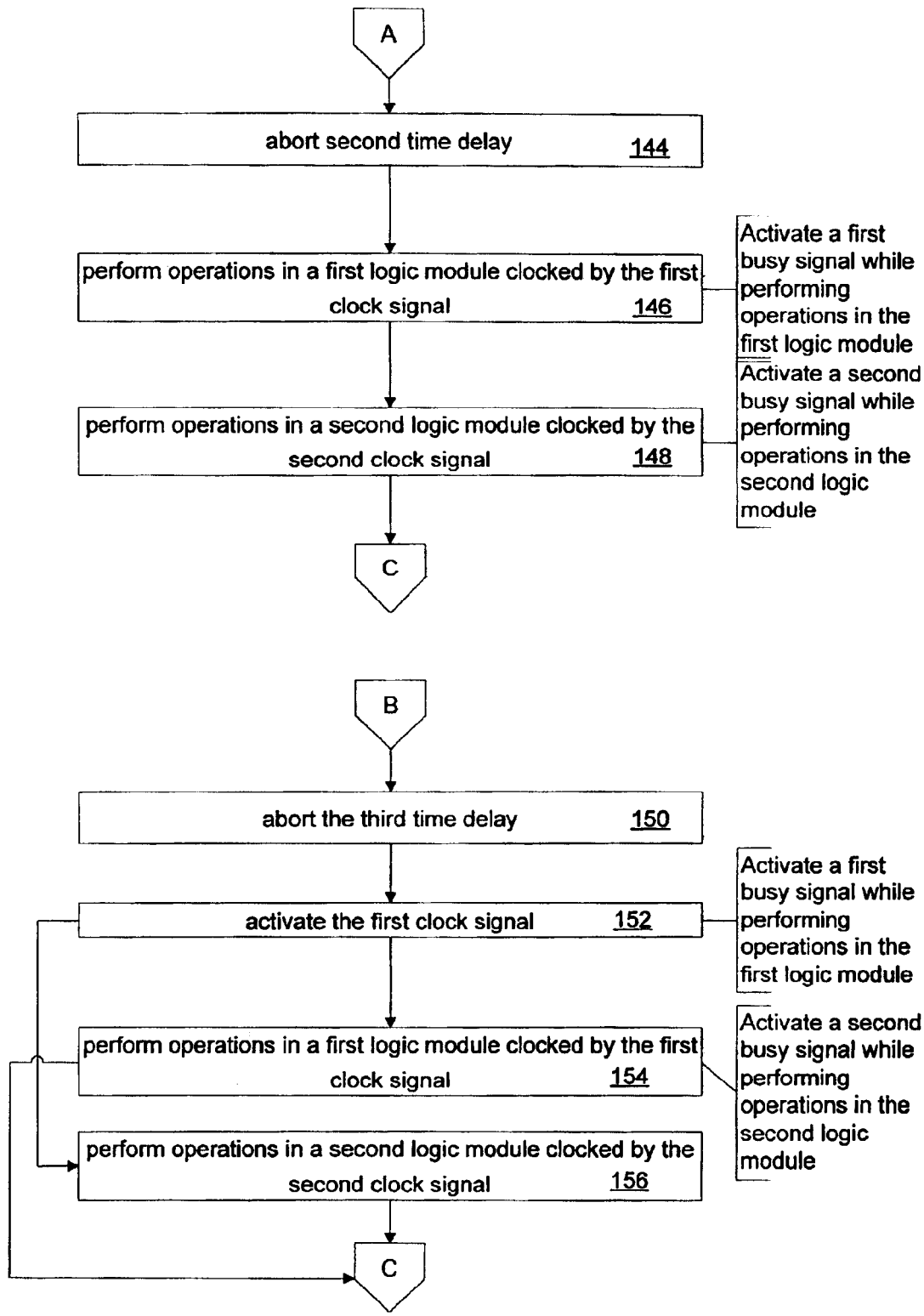

Referring to FIG. 5B, if another command is available
during the second time delay, then the second time delay is
aborted in step 144, and operations are performed in the first
and second logic modules, in steps 146 and 148, and the
busy signals for those modules are activated. Flow returns to
step 132, completion of the operations. Similarly, if another
command is available during the third time delay, the third
time delay is aborted in step 150, and the first clock signal
is activated in step 152. Operations are performed in the first
and second logic modules, in steps 154 and 156 and the busy
signals for those modules are activated. Flow returns to step
132, awaiting completion of the operations.

Although the present invention has been described in
considerable detail with reference to certain preferred ver-
sions thereof, other versions are possible. Therefore, the spirit and scope of the appended claims should not be limited to the description of the preferred versions contained herein.

What is claimed is:

1. An apparatus for managing power consumption in a system including at least two modules for processing commands, the apparatus comprising:
   a first module having a clock input for receiving a first clock signal, the first module being operative to perform operations based on a received command and to generate a first busy signal indicating when the first module is busy;
   a second module for performing operations and having a clock input for receiving a second clock signal, the second module being operative to generate a second busy signal indicating when the second module is busy;
   first control logic connected to receive the first and second busy signals from the first and second modules, respectively, and having inputs for receiving a system clock signal and a command available signal indicating when a command is available, and an output for providing an enable signal, the first control logic being operative to activate the enable signal and the first clock signal when a command is available, and deactivate the enable signal and the first clock signal after a first time delay following an indication that none of the modules is busy and a command is not available; and
   second control logic having inputs for receiving the enable signal and the system clock signal and being operative to activate the second clock signal after a second time delay following the assertion of the enable signal and to deactivate the second clock signal after a third time delay following the de-assertion of the enable signal.

2. An apparatus as recited in claim 1, wherein the first control logic is operative to assert the enable signal for at least as long as at least one of the first and second modules is currently busy.

3. An apparatus as recited in claim 1, wherein the first time delay is programmable.

4. An apparatus as recited in claim 1, wherein the second time delay is programmable.

5. An apparatus as recited in claim 1, wherein the third time delay is programmable.

6. An apparatus as recited in claim 1, wherein the second control logic is to keep on the second clock signal for at least as long as the first clock signal is on.

7. An apparatus as recited in claim 1, wherein the first and second modules are the first and second stages of a pipeline.

8. An apparatus as recited in claim 1,
   wherein the second control logic has an output for providing another enable signal that is asserted while the second clock signal is activated; and
   further comprising:
      a third module having a clock input for receiving a third clock signal, and being operative to generate a third busy signal indicating when the third module is busy; and
      third control logic having inputs for receiving the other enable signal and the system clock signal, and being operative to activate the third clock signal after a fourth time delay following the assertion of the other enable signal, and to deactivate the third clock signal after a fifth time delay following the de-assertion of the other enable signal.

9. An apparatus as recited in claim 8, wherein the fourth time delay is programmable.

10. An apparatus as recited in claim 8, wherein the fifth time delay is programmable.

11. An apparatus as recited in claim 8, wherein the first, second and third modules are first, second and third stages of a pipeline.

12. A method for managing power consumption in a system, the method comprising the steps of:
   receiving a command to perform one or more operations and an indication that a command is available;
   activating a first clock signal in response to the received command;
   performing operations in a first logic module in response to the activated first clock signal based on the received command;
   activating a first busy indicator while performing operations in response to the activated first clock signal;
   activating a second clock signal after a first time delay following the activated first clock signal;
   performing operations in a second logic module in response to the activated second clock signal;
   activating a second busy indicator while performing operations in response to the activated second clock signal;
   deactivating the first busy and second busy indicators when operations in the first and second modules, respectively, are completed;
   if there is no indication that a command is available, deactivating the first clock signal after a second time delay following the deactivation of all of the busy indicators; and
   deactivating the second clock signal after a third time delay following the deactivation of the first clock signal.

13. A method as recited in claim 12, wherein the first clock signal is activated for at least as long as at least one of the logic modules is busy.

14. A method as recited in claim 12, wherein the first time delay is programmable.

15. A method as recited in claim 12, wherein the second time delay is programmable.

16. A method as recited in claim 12, wherein the third time delay is programmable.

17. A method as recited in claim 12, further comprising the steps of:
   activating a third clock signal after a fourth time delay following the activation of the second clock signal;
   performing operations in a third logic module in response to the activated third clock signal;
   activating a third busy indicator while performing operations in response to the third clock signal;
   deactivating the third busy indicator when operations in the third logic module are completed; and
   deactivating the third clock signal after a fifth time delay following the deactivation of the second clock signal.

18. A method as recited in claim 17, wherein the fourth time delay is programmable.

19. A method as recited in claim 17, wherein the fifth time delay is programmable.

20. A method as recited in claim 17, wherein the first, second and third logic modules are the first, second and third stages of a pipeline.

* * * * *